(12) United States Patent
Wang et al.

(10) Patent No.: US 12,143,115 B2
(45) Date of Patent: Nov. 12, 2024

(54) CALIBRATION SYSTEM OF CANCELING EFFECT OF PHASE NOISE AND ANALOG-TO-DIGITAL CONVERTING DEVICE COMPRISING THE SAME

(71) Applicants: GLOBAL UNICHIP CORPORATION, Hsinchu (TW); TAIWAN SEMICONDUCTOR MANUFACTURING COMPANY, LTD., Hsinchu (TW)

(72) Inventors: Ting-Hao Wang, Hsinchu (TW); Jieh-Tsorng Wu, Hsinchu (TW)

(73) Assignees: GLOBAL UNICHIP CORPORATION, Hsinchu (TW); TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 170 days.

(21) Appl. No.: 18/052,204

(22) Filed: Nov. 2, 2022

(65) Prior Publication Data
US 2023/0361779 A1 Nov. 9, 2023

(30) Foreign Application Priority Data

May 5, 2022 (TW) .................................. 111117022

(51) Int. Cl.
*H03M 1/10* (2006.01)
*H03M 1/12* (2006.01)

(52) U.S. Cl.
CPC ....... *H03M 1/1009* (2013.01); *H03M 1/1245* (2013.01)

(58) Field of Classification Search
CPC .... H03M 1/12; H03M 1/1245; H03M 1/0836; H03M 1/0678; H03M 1/1009
See application file for complete search history.

(56) References Cited

U.S. PATENT DOCUMENTS 8,558,725 B2 * 10/2013 Kidambi ............. H03M 1/1052
341/118
9,900,023 B1 * 2/2018 Kinyua ................. H03M 3/46
(Continued)

FOREIGN PATENT DOCUMENTS

| JP | 2008244576 A | 10/2008 |
|---|---|---|
| JP | 2013055598 A | 3/2013 |
| WO | 2020103123 A1 | 5/2020 |

OTHER PUBLICATIONS

Chi-Wei Fan et al., Jitter Measurement and Compensation for Analog-to-Digital Converters, IEEE Transactions on Instrumentation and Measurement, vol. 58, No. 11, Nov. 2009, p. 3874-3884.

(Continued)

*Primary Examiner* — Lam T Mai
(74) *Attorney, Agent, or Firm* — CKC & Partners Co., LLC

(57) ABSTRACT

A calibration system includes a jitter-capturing analog-to-digital converter (ADC), a calibration value generating circuit and a first calculation circuit. The jitter-capturing ADC is configured to sample a to-be-sampled clock signal according to an operating clock signal to generate a first quantized output. The calibration value generating circuit is configured to receive the first quantized output and a second quantized output of a to-be-calibrated ADC to generate a calibration value. The operating clock signal is for driving the to-be-calibrated ADC to sample, and the calibration value is related to a phase noise of the operating clock signal. The first calculation circuit is coupled with the calibration value generating circuit, and configured to subtract the calibration value from the second quantized output to generate a third quantized output.

16 Claims, 10 Drawing Sheets

(56) References Cited

U.S. PATENT DOCUMENTS

| | | | |
|---|---|---|---|
| 10,218,373 B1* | 2/2019 | Wang | H03M 1/1023 |
| 10,461,764 B1* | 10/2019 | Paro Filho | H03M 1/1033 |
| 10,771,076 B1* | 9/2020 | Feldhaus | H04L 7/033 |
| 10,790,845 B1* | 9/2020 | Zanchi | H03M 1/0624 |
| 11,043,956 B1* | 6/2021 | Wan | H03M 1/1215 |
| 11,070,221 B1* | 7/2021 | Wang | H03M 1/0624 |
| 11,075,640 B1* | 7/2021 | Kang | H03M 1/121 |
| 11,082,054 B1* | 8/2021 | Cascio | H03M 1/0697 |
| 11,223,365 B1* | 1/2022 | Grout | H03M 1/12 |
| 11,451,250 B1* | 9/2022 | Dedic | H03M 1/0624 |
| 11,476,876 B1* | 10/2022 | Lavery | H03M 1/10 |
| 11,632,121 B1* | 4/2023 | Lok | H03M 1/0626 341/120 |
| 2011/0037628 A1* | 2/2011 | Petrovic | H03M 1/1038 341/120 |
| 2012/0068866 A1 | 3/2012 | Robinson | |
| 2013/0027233 A1* | 1/2013 | Nozaki | H03M 1/12 341/118 |
| 2013/0058437 A1* | 3/2013 | Oshima | H03M 1/0836 341/166 |
| 2016/0087643 A1* | 3/2016 | Nozaki | H03M 1/0836 341/118 |
| 2017/0237419 A1* | 8/2017 | Clara | H03K 5/13 327/231 |
| 2020/0235747 A1* | 7/2020 | Kang | H03M 1/0624 |
| 2021/0226644 A1* | 7/2021 | Kang | H03M 1/0626 |
| 2022/0131549 A1* | 4/2022 | Huang | H03M 1/1061 |
| 2022/0321135 A1* | 10/2022 | Chen | H03M 1/0836 |
| 2022/0345142 A1* | 10/2022 | Han | H03M 1/1028 |
| 2023/0018398 A1* | 1/2023 | Whitcombe | H03K 5/06 |
| 2023/0308120 A1* | 9/2023 | Hamilton | H04B 17/19 |
| 2024/0137034 A1* | 4/2024 | Gupta | H03M 1/1014 |

OTHER PUBLICATIONS

Zaid J. et al., Clock Jitter Compensation in High-Rate ADC Circuits, IEEE Transactions on Signal Processing, vol. 60, No. 11, Nov. 2012, p. 5738-5753.

Timothy Toroni, Can a clock generator act as a jitter cleaner?, https://e2e.ti.com/blogs_/b/analogwire/posts/can-a-clock-generator-act-as-a-jitter-cleaner, Mar. 23, 2017.

* cited by examiner

CALIBRATION SYSTEM OF CANCELING EFFECT OF PHASE NOISE AND ANALOG-TO-DIGITAL CONVERTING DEVICE COMPRISING THE SAME

RELATED APPLICATIONS

This application claims priority to Taiwan Application Serial Number 111117022, filed on May 5, 2022, which is herein incorporated by reference in its entirety.

BACKGROUND

Technical Field

The present disclosure relates to a calibration technique of an analog-to-digital converter (ADC). More particularly, the present disclosure relates to a calibration system capable of canceling the effect caused by the phase noise and to an analog-to-digital converting device including the calibration system.

Description of Related Art

The phase-locked loop is widely used in various high-speed circuits. For example, the phase-locked loop can be used in frequency synthesis to generate the output signal with the frequency that is an integer multiple of the frequency of the input signal. The clock signal generated by the phase-locked loop can be used to drive the analog-to-digital converter to sample, but the clock signal generated by the phase-locked loop usually has jitter effect and is hard to satisfy the stability required by the high-speed ADC to the clock signal. In addition, the clock generator that can generate the signal with low jitter, such as the crystal oscillator, is usually expensive.

SUMMARY

The disclosure provides a calibration system including a jitter-capturing analog-to-digital converter (ADC), a calibration value generating circuit and a first calculation circuit. The jitter-capturing ADC is configured to sample a to-be-sampled clock signal according to an operating clock signal to generate a first quantized output. The calibration value generating circuit is configured to receive the first quantized output and a second quantized output of a to-be-calibrated ADC to generate a calibration value. The operating clock signal is for driving the to-be-calibrated ADC to sample, and the calibration value is related to a phase noise of the operating clock signal. The first calculation circuit is coupled with the calibration value generating circuit, and configured to subtract the calibration value from the second quantized output to generate a third quantized output.

The disclosure provides a calibration system including a jitter-capturing ADC, a calibration value generating circuit and a first calculation circuit. The jitter-capturing ADC is configured to sample a to-be-sampled clock signal according to an operating clock signal in order to generate a first quantized output. The calibration value generating circuit is configured to receive the first quantized output and a second quantized output of a to-be-calibrated ADC in order to generate a calibration value. The to-be-sampled clock signal is for driving the to-be-calibrated ADC to sample, and the calibration value is related to a phase noise of the to-be-sampled clock signal. The first calculation circuit is coupled with the calibration value generating circuit, and configured to subtract the calibration value from the second quantized output to generate a third quantized output.

The disclosure provides an analog-to-digital converting device including a clock generator, at least one to-be-calibrated ADC, and a calibration system. Each to-be-calibrated ADC is configured to generate a second quantized output. One of the at least one to-be-calibrated ADC samples according to an output of the clock generator in order to generate the second quantized output. The calibration system is configured to receive an input of the clock generator, the output of the clock generator and the second quantized output of the one of the at least one to-be-calibrated ADC in order to generate a calibration value. The calibration system is further configured to calibrate the second quantized output of each to-be-calibrated ADC according to the calibration value in order to generate a third quantized output. The calibration value is related to a phase noise of the output of the clock generator.

One of the advantages of the above calibration system and analog-to-digital converting device is that they are capable of mitigating or canceling sampling errors in the quantized outputs caused by the phase noise of the clock signal.

It is to be understood that both the foregoing general description and the following detailed description are by examples, and are intended to provide further explanation of the disclosure as claimed.

DETAILED DESCRIPTION

Figure 1:
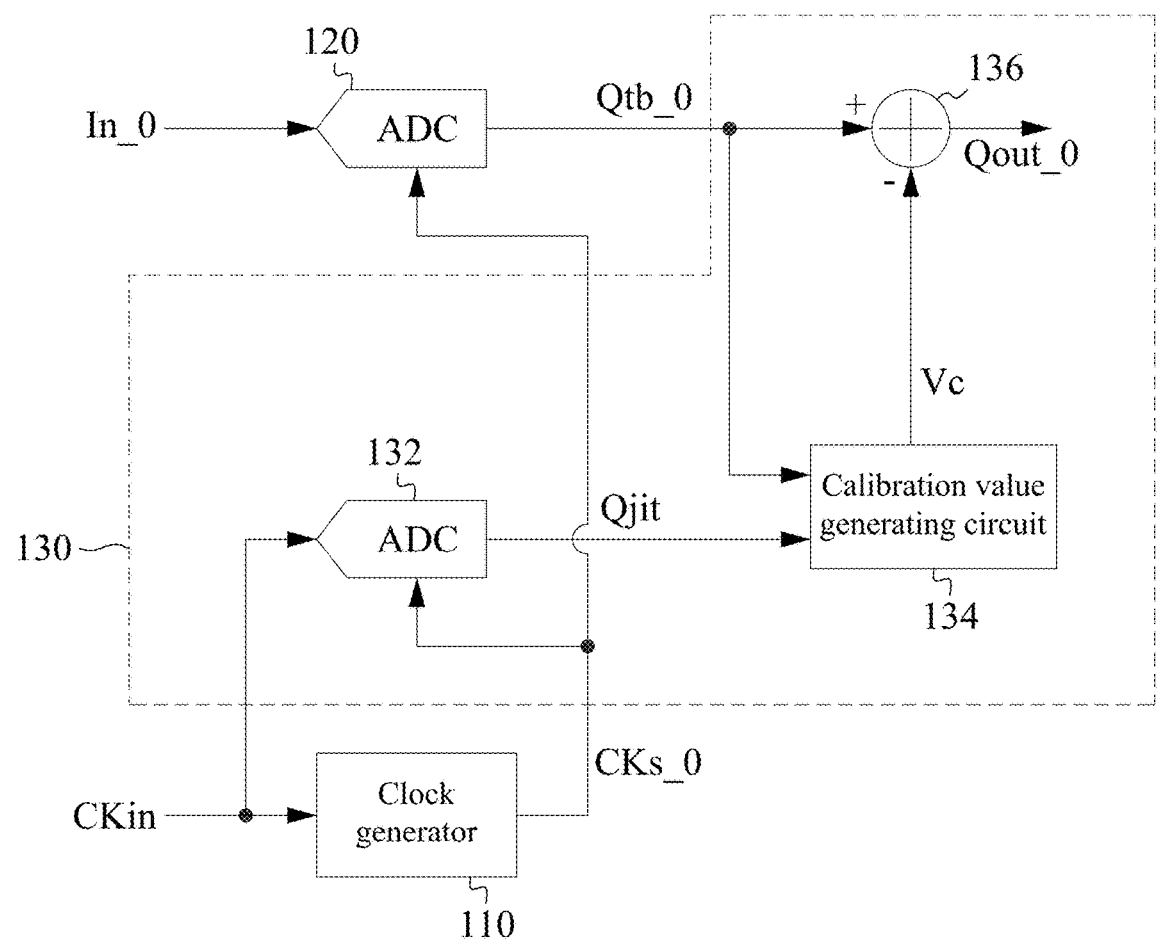
FIG. 1 is a simplified functional block diagram of an analog-to-digital converting device according to one embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

FIG. 1 is a simplified functional block diagram of an analog-to-digital converting device 100 according to one embodiment of the present disclosure. The analog-to-digital converting device 100 comprises a clock generator 110, a to-be-calibrated analog-to-digital converter (ADC) 120 and a calibration system 130. The clock generator 110 is configured to receive a clock signal CKin to generate a clock signal CKs_0. In some embodiments, a frequency of the clock signal CKin is M times of a frequency of the clock signal CKs_0, that is, a period of the clock signal CKs_0 is M times of a period of the clock signal CKin, in which M is a positive number (e.g., 4/19). In some embodiments, the clock generator 110 comprises a phase-locked loop. The to-be-calibrated ADC 120 is coupled with the clock generator 110 and the calibration system 130. The to-be-calibrated ADC 120 is configured to sample an input signal In_0 according to the clock signal CKs_0, in order to output a to-be-calibrated quantized output Qtb_0 to the calibration system 130. The calibration system 130 is configured to calibrate the quantized output Qtb_0, so as to mitigate or cancel the sampling error in the quantized output Qtb_0 that is caused by the phase noise of the clock signal CKs_0, thereby generating a quantized output Qout_0. The phase noise can be understood as the jittering phenomenon of the clock signal CKs_0 in the time domain. In some embodiments, the sampling error is a voltage difference between the correct sampling result and the actual sampling result of the to-be-calibrated ADC 120.

In some embodiments, the quantized output Qtb_0 of the to-be-calibrated ADC 120 can be described by the following Formula 1, in which Formula 1 can be re-written as the following Formula 2 based on the angle sum identities. In Formula 1 and Formula 2, the symbol "Fin_0" represents a frequency of the input signal In_0; the symbol "n" represents the n-th sampling and n is a positive integer; the symbol "Ts" represents the period of the clock signal CKs_0; the symbol "t_in" represents the sampling time error of the to-be-calibrated ADC 120 caused by the phase noise of the clock signal CKs_0.

$$Q\_tb0 = \sin[2\times\pi\times Fin\_0\times(n\times Ts + t\_jn)] \quad \text{Formula 1}$$

$$Q\_tb0 = \sin[2\times\pi\times Fin\_0\times(n\times Ts)]\times\cos(2\times\pi\times Fin\_0\times t\_jn) \quad \text{Formula 2}$$
$$+ \cos[2\times\pi\times Fin\_0\times(n\times Ts)]\times\sin(2\times\pi\times Fin\_0\times t\_jn)$$

In the following paragraphs, for the sake of brevity, the correct sampling result of the to-be-calibrated ADC 120 in the formulae (i.e., sin[2×π×Fin_0×(n×Ts)] in Formula 2) is represented by the symbol "X(n)". In some embodiments, the sampling time error t_in caused by the phase noise generally is significantly small, such as approximate to zero, thereby Formula 2 can be further re-written as the following Formula 3. Notably, with respect to the high-speed ADC, the signal it samples usually has the frequency in the megahertz (Mhz) level or the gigahertz (GHz) level, and therefore even a small sampling time error t_in may cause the ADC to generate a very different output. As can be known from Formula 3, the quantized output Qtb_0 is substantially the sum of: (1) the correct sampling result (the symbol "X(n)") and (2) a product of a slope of the correct sampling result (the symbol "dX(n)/dt") and the sampling time error t_in.

$$Q\_tb0 = X(n)\times 1 + \frac{dX(n)}{dt}\times\frac{1}{2\times\pi\times Fin\_0}\times 2\times\pi\times Fin\_0\times t\_jn \quad \text{Formula 3}$$

-continued
$$= X(n)\times 1 + \frac{dX(n)}{dt}\times t\_jn$$

In some embodiments, the calibration system 130 comprises a jitter-capturing ADC 132, a calibration value generating circuit 134 and a calculation circuit 136. The jitter-capturing ADC 132 is configured to sample the clock signal CKin according to the clock signal CKs_0 in order to generate a quantized output Qjit, that is, the jitter-capturing ADC 132 is configured to sample an input of the clock generator 110 according to an output of the clock generator 110.

The calibration value generating circuit 134 is configured to receive the quantized output Qjit from the jitter-capturing ADC 132, and configured to receive the quantized output Qtb_0 from the to-be-calibrated ADC 120. The calibration value generating circuit 134 is further configured to generate a calibration value Vc, according to the quantized output Qjit and the quantized output Qtb_0. In one embodiment, the calibration value Vc is related to the phase noise of the clock signal CKs_0, that is, related to the sampling time error t_in in the aforementioned Formula 3. The calculation circuit 136 is coupled with the to-be-calibrated ADC 120 and the calibration value generating circuit 134, and configured to subtract the calibration value Vc from the quantized output Qtb_0 to calibrate the sampling error, thereby obtaining the quantized output Qout_0 that is essentially the correct sampling result of the to-be-calibrated ADC 120.

Next, the calculation method of the calibration value Vc will be described. For ease of understanding, M is assumed to be a positive integer in the embodiments of the following paragraphs, but this disclosure is not limited thereto. In some embodiments, the quantized output Qjit of the jitter-capturing ADC 132 can be described by the following Formula 4, and the Formula 4 can be re-written as the following Formula 5 based on the angle sum identities. In Formula 4 and Formula 5, the symbol "Fs" represents the frequency of the clock signal CKs_0; and "M×Fs" is the frequency of the clock signal CKin.

$$Q\_jit = \sin[2\times\pi\times M\times Fs\times(n\times Ts + t\_jn)] \quad \text{Formula 4}$$

Formula 5
$$Q\_jit =$$
$$\sin\left[2\times\pi\times M\times\frac{1}{Ts}\times(n\times Ts)\right]\times\cos\left(2\times\pi\times M\times\frac{1}{Ts}\times t\_jn\right) +$$
$$\cos\left[2\times\pi\times M\times\frac{1}{Ts}\times(n\times Ts)\right]\times\sin\left(2\times\pi\times M\times\frac{1}{Ts}\times t\_jn\right)$$

In the embodiments that M is a positive integer, Formula 5 can be re-written as the following Formula 6. As can be known from Formula 6, the quantized output Qjit is essentially a sum of a constant (e.g., 0) and a constant multiple of the sampling time error t_in, since the period of the clock signal CKs_0 and M are known parameters.

$$Q\_jit = 0\times 1 + 1\times 2\times\pi\times M\times\frac{1}{Ts}\times t\_jn \quad \text{Formula 6}$$

Figure 2:
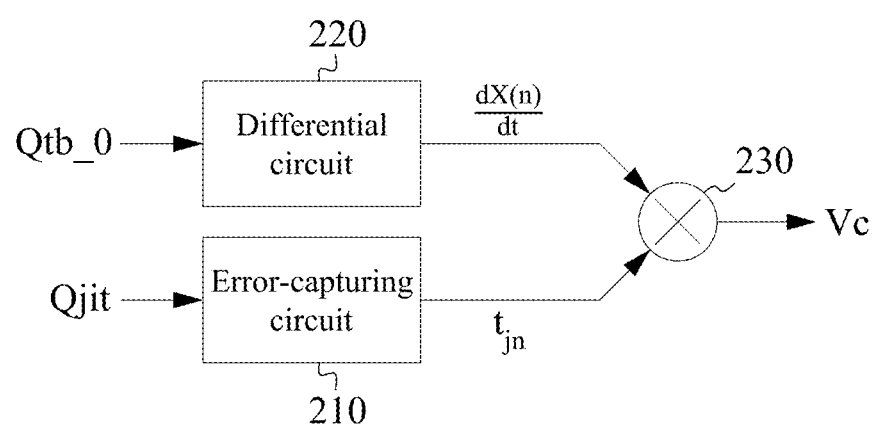
FIG. 2 is a simplified functional block diagram of a calibration value generating circuit according to one embodiment of the present disclosure.

FIG. 2 is a simplified functional block diagram of a calibration value generating circuit 200 according to one embodiment of the present disclosure. The calibration value generating circuit 200 can be used to realize the calibration value generating circuit 134 of FIG. 1. The calibration value generating circuit 200 comprises an error-capturing circuit 210, a differential circuit 220 and a calculation circuit 230. The error-capturing circuit 210 is configured to receive the quantized output Qjit from the jitter-capturing ADC 132, and configured to calculate the sampling time error t_in from the quantized output Qjit according to the period of the clock signal CKs_0. In some embodiments, the error-capturing circuit 210 obtains the product of the sampling time error t_in and the constant from the quantized output Qjit, so as to further obtain the sampling time error t_in. As can be known from Formula 6, this constant is 2×π×M×(1/Ts), that is, this constant is negatively correlated with the period of the clock signal CKs_0 and positively correlated with M.

The differential circuit 220 is configured to receive the quantized output Qtb_0 from the to-be-calibrated ADC 120, and configured to calculate a slope of the quantized output Qtb_0. In some embodiments, the differential circuit 220 calculates the slope according to the (n−1)-th and (n+1)-th sampling results in the quantized output Qtb_0, but this disclosure is not limited thereto. The differential circuit 220 may further use the (n−2)-th and (n+2)-th sampling results, or still further use the (n−3)-th and (n+3)-th sampling results. In a considerable short time period, the effect caused by the jitter of the clock signal CKs_0 may be neglected, and therefore the (n−1)-th and (n+1)-th sampling results may be seen as the correct sampling results, which will be respectively represented by symbols "X(n−1)" and "X(n+1)" in the following paragraphs. As such, the slope of the quantized output Qtb_0 that is calculated by the differential circuit 220 is substantially the slope of the correct sampling result in Formula 3. The differential circuit 220 can calculate the slope by the following Formula 7.

$$\frac{dX(n)}{dt} = \frac{X(n+1) - X(n-1)}{2} \quad \text{Formula 7}$$

The calculation circuit 230 is configured to multiply the sampling time error t_in by the slope of the correct sampling result in order to generate the calibration value Vc, that is, Vc=(dX(n)/dt)×t_in. Then, the calculation circuit 230 may provide the calibration value Vc to the calculation circuit 136 of FIG. 1.

Figure 3:
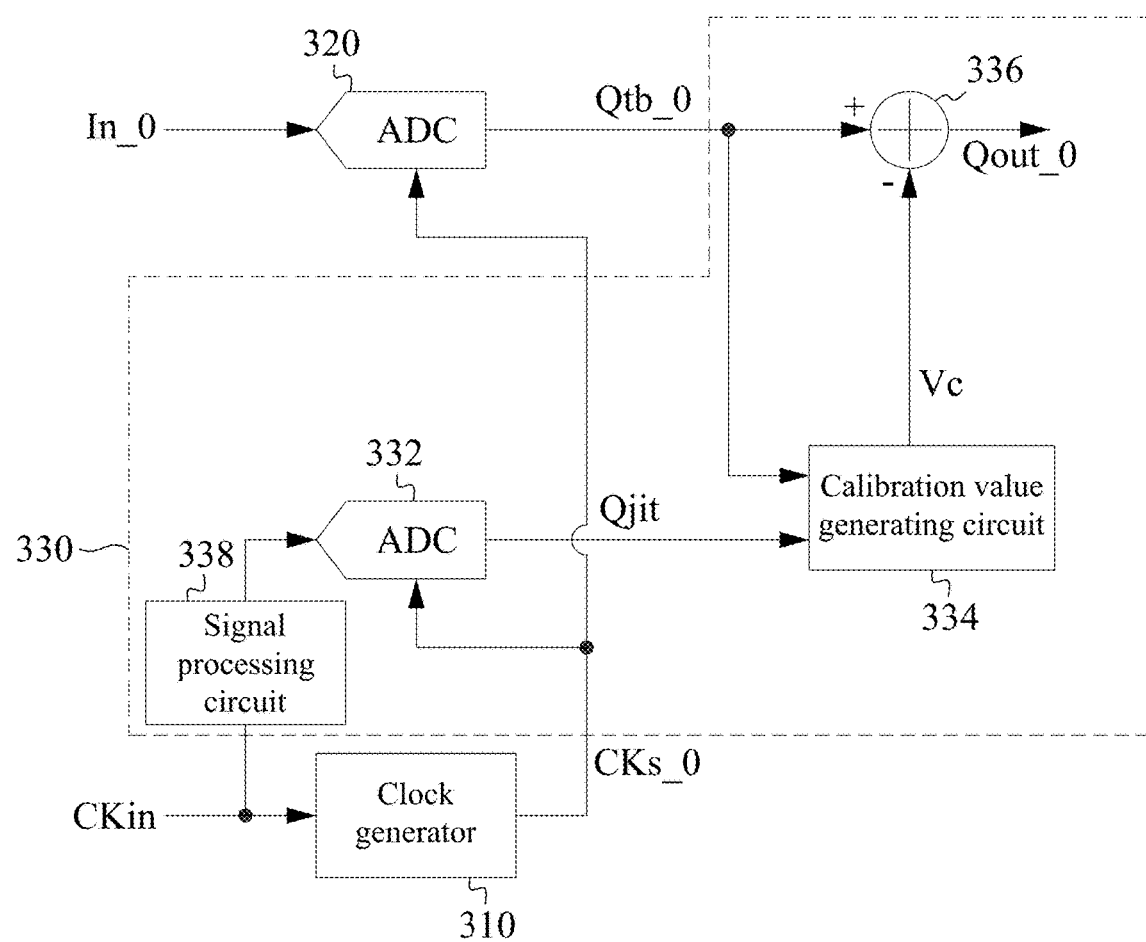
FIG. 3 is a simplified functional block diagram of an analog-to-digital converting device according to one embodiment of the present disclosure.

FIG. 3 is a simplified functional block diagram of an analog-to-digital converting device 300 according to one embodiment of the present disclosure. The analog-to-digital converting device 300 comprises a clock generator 310, a to-be-calibrated ADC 320 and a calibration system 330. The analog-to-digital converting device 300 is similar to the analog-to-digital converting device 100 of FIG. 1, and only the differences are discussed below, for the sake of brevity.

The calibration system 330 comprises a jitter-capturing ADC 332, a calibration value generating circuit 334, a calculation circuit 336 and a signal processing circuit 338. The signal processing circuit 338 is coupled between the input terminal of the clock generator 310 and the input terminal of the jitter-capturing ADC 332. The signal processing circuit 338 is configured to receive the clock signal CKin, and is configured to conduct one or more of the following signal processing operations to the clock signal CKin before the clock signal CKin is inputted to the jitter-capturing ADC 332: amplifying, frequency dividing and slope adjusting. In some embodiments, the clock signal CKin processed by the signal processing circuit 338 has a ramp waveform or a sawtooth waveform. The signal processing circuit 338 controls the waveform and the frequency of the clock signal CKin, so as to control the value of M and improve the signal-to-noise ratio of the clock signal CKin. As such, magnitude of the constants in Formula 6 is stabilized, and the precision of the sampling time error t_in obtained by the calibration system 330 is also improved.

The jitter-capturing ADC 332 is configured to sample the clock signal CKin outputted by the signal processing circuit 338 according to the clock signal CKs_0, so as to generate and output the quantized output Qjit to the calibration value generating circuit 334. The calibration value generating circuit 334 and the calculation circuit 336 have components, connection relationships and operations similar to the calibration value generating circuit 134 and the calculation circuit 136 of FIG. 1, respectively, and the detailed descriptions thereof are omitted herein, for the sake of brevity.

Figure 4:
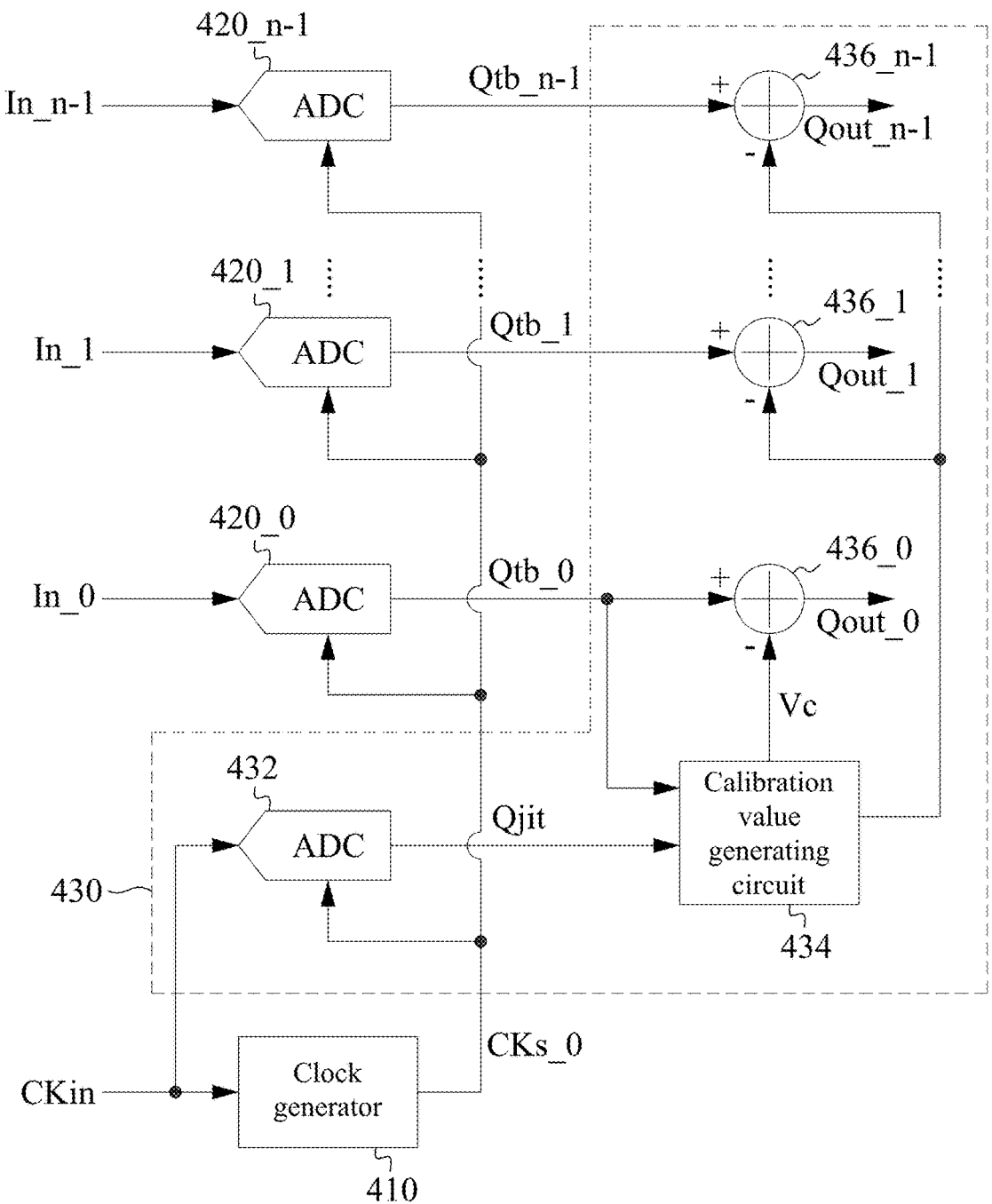
FIG. 4 is a simplified functional block diagram of an analog-to-digital converting device according to one embodiment of the present disclosure.

FIG. 4 is a simplified functional block diagram of an analog-to-digital converting device 400 according to one embodiment of the present disclosure. The analog-to-digital converting device 400 comprises a clock generator 410, a plurality of to-be-calibrated ADCs 420_0-420_$n$−1 and a calibration system 430. The clock generator 410 is similar to the clock generator 110 of FIG. 1, and the detailed descriptions are omitted herein, for the sake of brevity. The to-be-calibrated ADCs 420_0-420_$n$−1 are configured to receive the input signals In_0-In_n−1, respectively, but this disclosure is not limited thereto. The to-be-calibrated ADCs 420_0-420_$n$−1 need not to receive different input signals. The to-be-calibrated ADCs 420_0-420_$n$−1 are configured to sample the input signals In_0-In_n−1 according to the clock signal CKs_0, so as to respectively generate quantized outputs Qtb_0-Qtb_n−1. In other words, each of the to-be-calibrated ADCs 420_0-420_$n$−1 samples according to the clock signal CKs_0.

The calibration system 430 is configured to calibrate quantized outputs Qout_0-Qout_n−1 to mitigate or cancel the sampling errors of the quantized outputs Qout_0-Qout_n−1 that are caused by the phase noise of the clock signal CKs_0. The calibration system 430 comprises a jitter-capturing ADC 432, a calibration value generating circuit 434 and a plurality of calculation circuits 436_0-436_$n$−1. The calculation circuits 436_0-436_$n$−1 are configured to receive the quantized outputs Qtb_0-Qtb_n−1, respectively, and configured to receive the calibration value Vc from the calibration value generating circuit 434. The calculation circuits 436_0-436_$n$−1 are further configured to subtract the calibration value Vc from each of the quantized outputs Qtb_0-Qtb_n−1, so as to respectively generate the quantized outputs Qout_0-Qout_n−1. The quantized outputs Qout_0-Qout_n−1 are essentially the correct sampling results of the to-be-calibrated ADCs 420_0-420_$n$−1, respectively.

The jitter-capturing ADC 432 and the calibration value generating circuit 434 have components, connection relationships and operations similar to the jitter-capturing ADC 132 and the calibration value generating circuit 134 of FIG. 1, respectively, and the detailed descriptions thereof are omitted herein, for the sake of brevity. It is worth mentioning that the calibration value generating circuit 434 may use any one of the quantized outputs Qtb_0-Qtb_n−1 to calculate the calibration value Vc.

Figure 5:
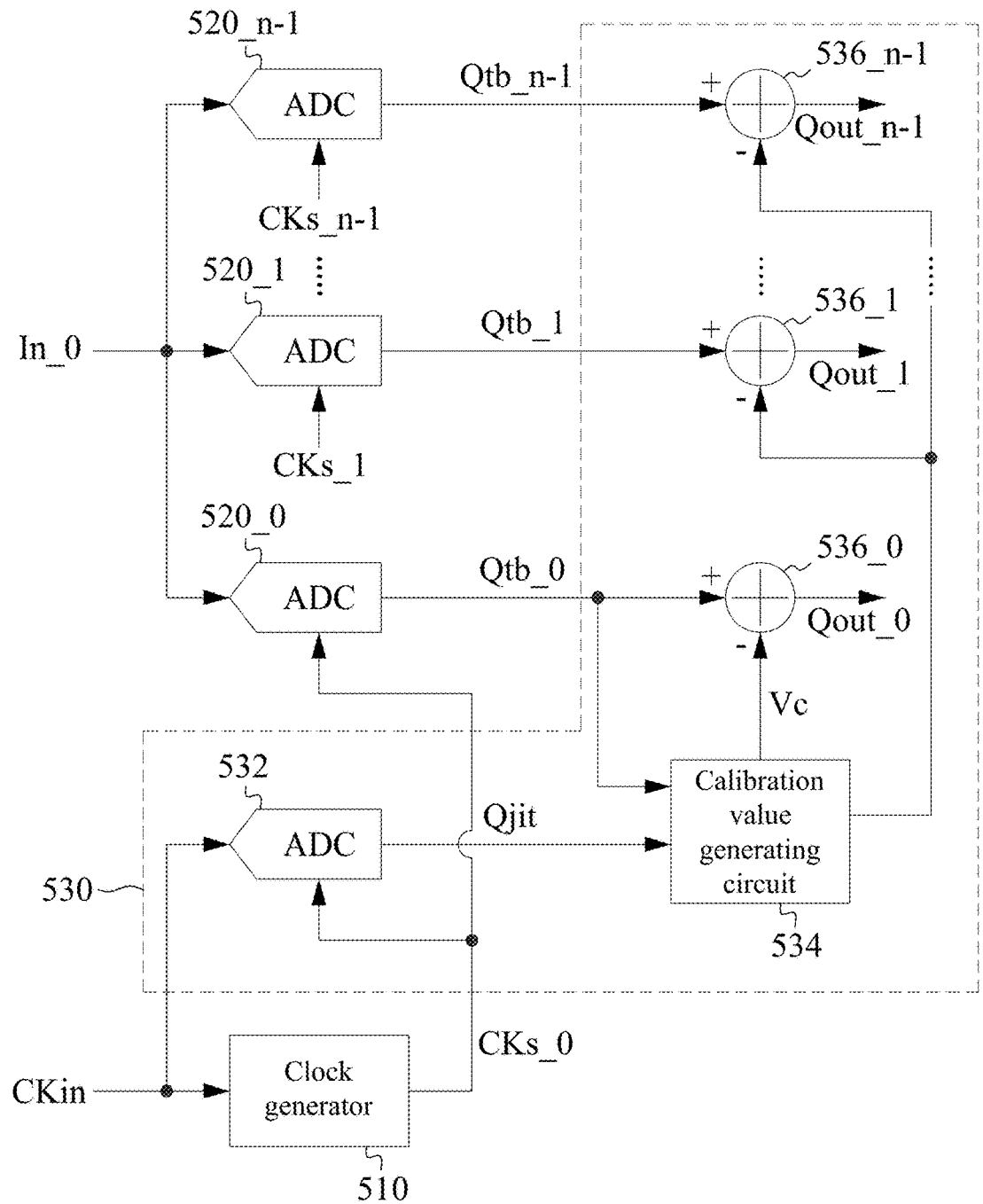
FIG. 5 is a simplified functional block diagram of an analog-to-digital converting device according to one embodiment of the present disclosure.

FIG. 5 is a simplified functional block diagram of an analog-to-digital converting device 500 according to one embodiment of the present disclosure. The analog-to-digital converting device 500 comprises a clock generator 510, a plurality of to-be-calibrated ADCs 520_0-520_$n$−1 and a calibration system 530. The calibration system 530 comprises a jitter-capturing ADC 532, a calibration value generating circuit 534 and a plurality of calculation circuits 536_0-536_$n$−1. The analog-to-digital converting device 500 is similar to the analog-to-digital converting device 400 of FIG. 4, and therefore only the differences are discussed below.

The to-be-calibrated ADCs 520_0-520_$n$−1 are configured to sample the input signal In_0 respectively according to a plurality of clock signals CKs_0-CKs_n−1, in order to generate the quantized outputs Qtb_0-Qtb_n−1, respectively. The clock signals CKs_0-CKs_n−1 are time-interleaved clock signals. In some embodiments, the analog-to-digital converting device 500 can be used to implement a time-interleaved ADC, and may comprise a multiplexer (not shown in FIG. 5) to generate a digital output signal based on the quantized outputs Qout_0-Qout_n−1. The to-be-calibrated ADC 520_0 and the jitter-capturing ADC 532 sample according to the clock signal CKs_0. In some embodiments, the phase of the clock signal CKs_0 leads the phases of the other time-interleaved clock signals CKs_1-CKs_n−1.

In some embodiments, the calibration system 430 of FIG. 4 or the calibration system 530 of FIG. 5 further comprises a signal processing circuit (not shown). Before the clock signal CKin is inputted to the jitter-capturing ADC 432 of FIG. 4 or the jitter-capturing ADC 532 of FIG. 5, the signal processing circuit is configured to conduct one or more of the following signal processing operations to the clock signal CKin: amplifying, frequency dividing and slope adjusting. In addition, the clock signal CKs_0 provided by the signal processing circuit to the jitter-capturing ADC 432 of FIG. 4 or the jitter-capturing ADC 532 of FIG. 5 may have a ramp waveform or a sawtooth waveform.

Figure 6:
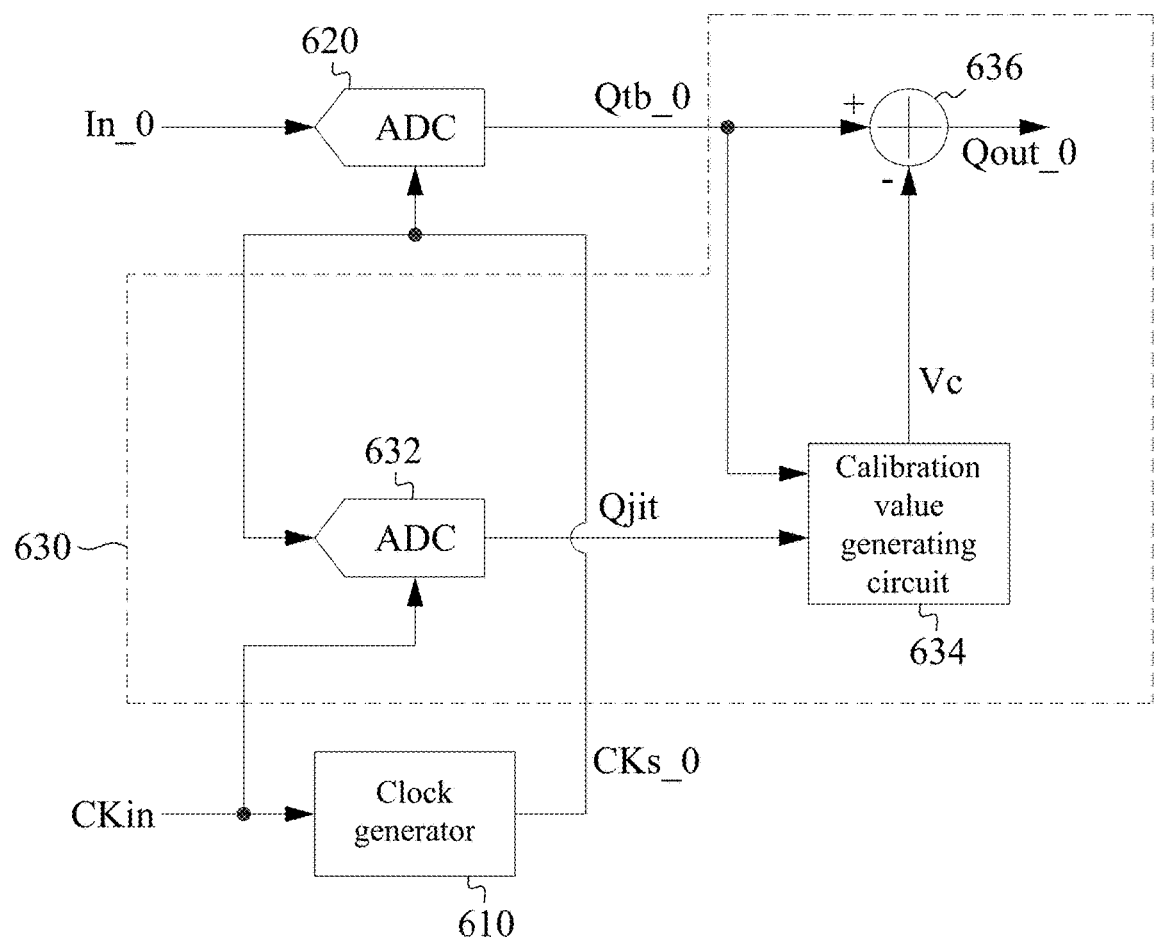
FIG. 6 is a simplified functional block diagram of an analog-to-digital converting device according to one embodiment of the present disclosure.

FIG. 6 is a simplified functional block diagram of an analog-to-digital converting device 600 according to one embodiment of the present disclosure. The analog-to-digital converting device 600 comprises a clock generator 610, a to-be-calibrated ADC 620 and a calibration system 630. The clock generator 610 and the to-be-calibrated ADC 620 are similar to the clock generator 110 and the to-be-calibrated ADC 120 of FIG. 1, respectively, and the detailed descriptions thereof are omitted herein, for the sake of brevity. The calibration system 630 is configured to calibrate the quantized output Qtb_0 to mitigate or cancel the sampling error in the quantized output Qtb_0 that is caused by the phase noise of the clock signal CKs_0, so as to generate the quantized output Qout_0.

The calibration system 630 comprises a jitter-capturing ADC 632, a calibration value generating circuit 634 and a calculation circuit 636. The jitter-capturing ADC 632 is configured to sample the clock signal CKs_0 according to the clock signal CKin in order to generate the quantized output Qjit, that is, the jitter-capturing ADC 632 is configured to sample the output of the clock generator 610 according to the input of the clock generator 610.

The calibration value generating circuit 634 is configured to receive the quantized output Qjit from the jitter-capturing ADC 632, and configured to receive the quantized output Qtb_0 from the to-be-calibrated ADC 620. The calibration value generating circuit 634 is further configured to generate the calibration value Vc according to the quantized output Qjit and the quantized output Qtb_0. In one embodiment, the calibration value Vc is related to the phase noise of the clock signal CKs_0, that is, related to the sampling time error t_in in the aforesaid Formula 3. The calculation circuit 636 is coupled with the to-be-calibrated ADC 620 and the calibration value generating circuit 634, and is configured to subtract the calibration value Vc from the quantized output Qtb_0 to calibrate the sampling error, thereby obtaining the quantized output Qout_0 that is substantially the correct sampling result of the to-be-calibrated ADC 620.

Next, the calculation method of the calibration value Vc will be discussed. In some embodiments, the quantized output Qjit of the jitter-capturing ADC 632 can be described by the following Formula 8 and the Formula 8 can be re-written as the following Formula 9 based on the angle sum identities. In Formula 8 and Formula 9, the symbol "Tcin" represents the period of the clock signal CKin; and "(1/M)×Tcin" is the period of the clock signal CKs_0.

$$Q\_jit = \sin[2\times \pi \times Fs \times (n\times Tcin + t\_jn)] \quad \text{Formula 8}$$

$$Q\_jit = \sin\left[2\times \pi \times \frac{1}{M} \times \frac{1}{Tcin} \times (n\times Tcin)\right] \times \quad \text{Formula 9}$$
$$\cos\left(2\times \pi \times \frac{1}{M} \times \frac{1}{Tcin} \times t\_jn\right) +$$
$$\cos\left[2\times \pi \times \frac{1}{M} \times \frac{1}{Tcin} \times (n\times Tcin)\right] \times \sin$$
$$\left(2\times \pi \times \frac{1}{M} \times \frac{1}{Tcin} \times t\_jn\right)$$

In the embodiments that 1/M is a positive integer, Formula 9 can be re-written as the following Formula 10. As can be known form Formula 10, the quantized output Qjit substantially equals to a sum of a constant (e.g., 0) and a constant multiple of the sampling time error t_in, since the period of the clock signal CKin and M are known parameters.

$$Q\_jit = 0\times 1 + 1\times 2\times \pi \times \frac{1}{M} \times \frac{1}{Tcin} \times t\_jn \quad \text{Formula 10}$$

In some embodiments, the calibration value generating circuit 634 can be implemented using the calibration value generating circuit 200 of FIG. 2. Reference is made to FIG. 2 and FIG. 6, in this situation, the error-capturing circuit 210 is configured to receive the quantized output Qjit form the jitter-capturing ADC 632, and configured to calculate the sampling time error t_in from the quantized output Qjit according to the period of the clock signal CKin. In some embodiments, the error-capturing circuit 210 obtains a product of the sampling time error t_in and the constant from the quantized output Qjit, so as to further obtain the sampling time error t_in. As can be known from Formula 10, this constant is 2×π×(1/M)×(1/Tcin), that is, this constant is negatively correlated with the period of the clock signal CKin and negatively correlated with M.

Then, the calibration value generating circuit 634 calculates the calibration value Vc according to the sampling time error t_in. The rest calculation process is similar to those described above with reference to FIG. 2, and the detailed descriptions thereof are omitted herein, for the sake of brevity. The calibration value generating circuit 634 can provide the calibration value Vc to the calculation circuit 636.

Figure 7:
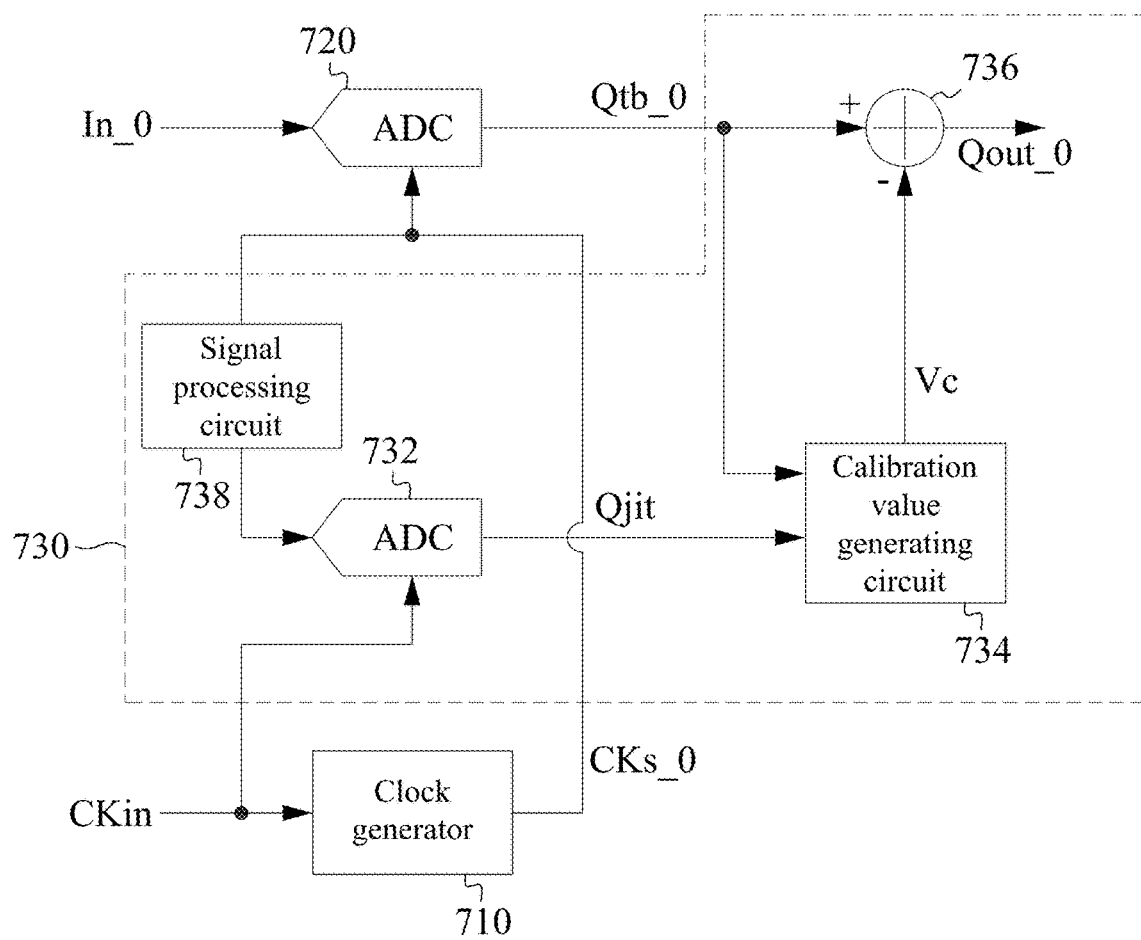
FIG. 7 is a simplified functional block diagram of an analog-to-digital converting device according to one embodiment of the present disclosure.

FIG. 7 is a simplified functional block diagram of an analog-to-digital converting device 700 according to one embodiment of the present disclosure. The analog-to-digital converting device 700 comprises a clock generator 710, a to-be-calibrated ADC 720 and a calibration system 730. The analog-to-digital converting device 700 is similar to the analog-to-digital converting device 600 of FIG. 6, and only the differences are discussed below, for the sake of brevity.

The calibration system 730 comprises a jitter-capturing ADC 732, a calibration value generating circuit 734, a calculation circuit 736 and a signal processing circuit 738. The signal processing circuit 738 is coupled between the output terminal of the clock generator 710 and the input terminal of the jitter-capturing ADC 732. The signal processing circuit 738 is configured to receive the clock signal CKs_0, and configured to conduct one or more of the following signal processing operations to the clock signal CKs_0 before the clock signal CKs_0 is inputted to the jitter-capturing ADC 732: amplifying, frequency dividing and slope adjusting. In some embodiments, the clock signal CKs_0 processed by the signal processing circuit 738 has a ramp waveform or a sawtooth waveform. The signal processing circuit 738 controls the waveform and the frequency of the clock signal CKs_0 to control the value of M and improve the signal-to-noise ratio of the clock signal CKs_0. As such, magnitude of the constants in Formula 10 is stabilized, and the precision of the sampling time error t_in obtained by the calibration system 730 is improved.

The jitter-capturing ADC 732 is configured to sample the clock signal CKs_0 outputted by the signal processing circuit 738 according to the clock signal CKin, so as to generate and output the quantized output Qjit to the calibration value generating circuit 734. The calibration value generating circuit 734 and the calculation circuit 736 have components, connection relationships and operations similar to the calibration value generating circuit 634 and the calculation circuit 636 of FIG. 6, respectively, and the detailed descriptions thereof are omitted herein, for the sake of brevity.

Figure 8:
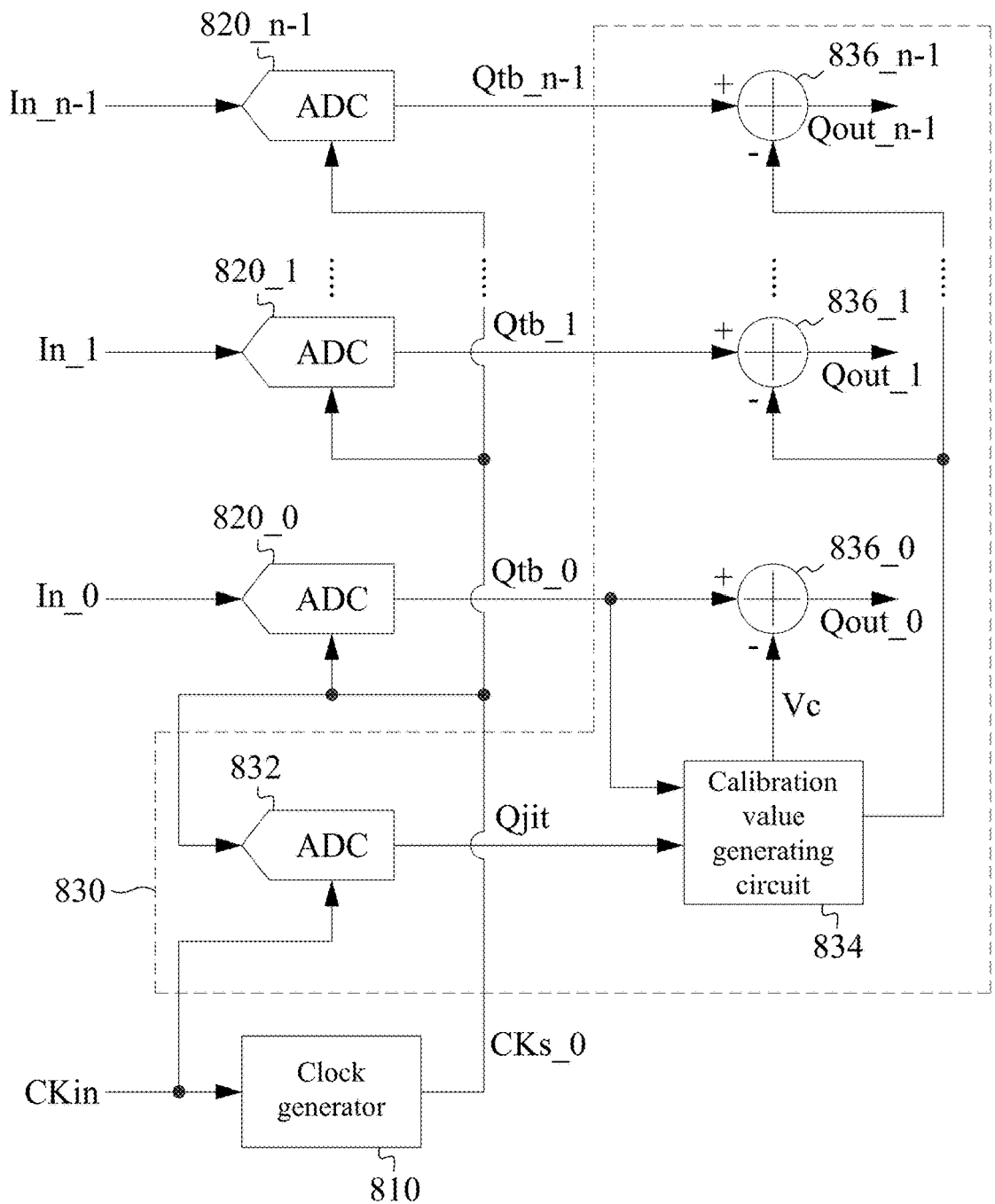
FIG. 8 is a simplified functional block diagram of an analog-to-digital converting device according to one embodiment of the present disclosure.

FIG. 8 is a simplified functional block diagram of an analog-to-digital converting device 800 according to one embodiment of the present disclosure. The analog-to-digital converting device 800 comprises a clock generator 810, a plurality of to-be-calibrated ADCs 820_0-820_n-1 and a calibration system 830. The clock generator 810 is similar to the clock generator 110 of FIG. 1, and the detailed descriptions thereof are omitted herein, for the sake of brevity. The to-be-calibrated ADCs 820_0-820_n-1 are configured to receive the input signals In_0-In_n-1, respectively, but this disclosure is not limited thereto. The to-be-calibrated ADCs 820_0-820_n-1 need not to receive different input signals. The to-be-calibrated ADCs 820_0-820_n-1 are configured to sample the input signals In_0-In_n-1 according to the clock signal CKs_0 in order to generate the quantized outputs Qtb_0-Qtb_n-1, respectively. In other words, each of the to-be-calibrated ADCs 820_0-820_n-1 samples according to the clock signal CKs_0.

The calibration system 830 is configured to calibrate the quantized outputs Qout_0-Qout_n-1, so as to mitigate or cancel the sampling errors in the quantized outputs Qout_0-Qout_n-1 caused by the phase noise of the clock signal CKs_0. The calibration system 830 comprises a jitter-capturing ADC 832, a calibration value generating circuit 834 and a plurality of calculation circuits 836_0-836_n-1. The calculation circuits 836_0-836_n-1 are configured to receive the quantized outputs Qtb_0-Qtb_n-1, respectively, and configured to receive the calibration value Vc from the calibration value generating circuit 834. The calculation circuits 836_0-836_n-1 are configured to subtract the calibration value Vc from each of the quantized outputs Qtb_0-Qtb_n-1 to respectively generate the quantized outputs Qout_0-Qout_n-1. The quantized outputs Qout_0-Qout_n-1 are substantially the correct sampling results of the to-be-calibrated ADCs 820_0-820_n-1, respectively.

The jitter-capturing ADC 832 and the calibration value generating circuit 834 have components, connection relationships and operations similar to the jitter-capturing ADC 632 and the calibration value generating circuit 634 of FIG. 6, respectively, and the detailed descriptions thereof are omitted herein, for the sake of brevity. It is worth mentioning that the calibration value generating circuit 834 can use any one of the quantized outputs Qtb_0-Qtb_n-1 to calculate the calibration value Vc.

Figure 9:
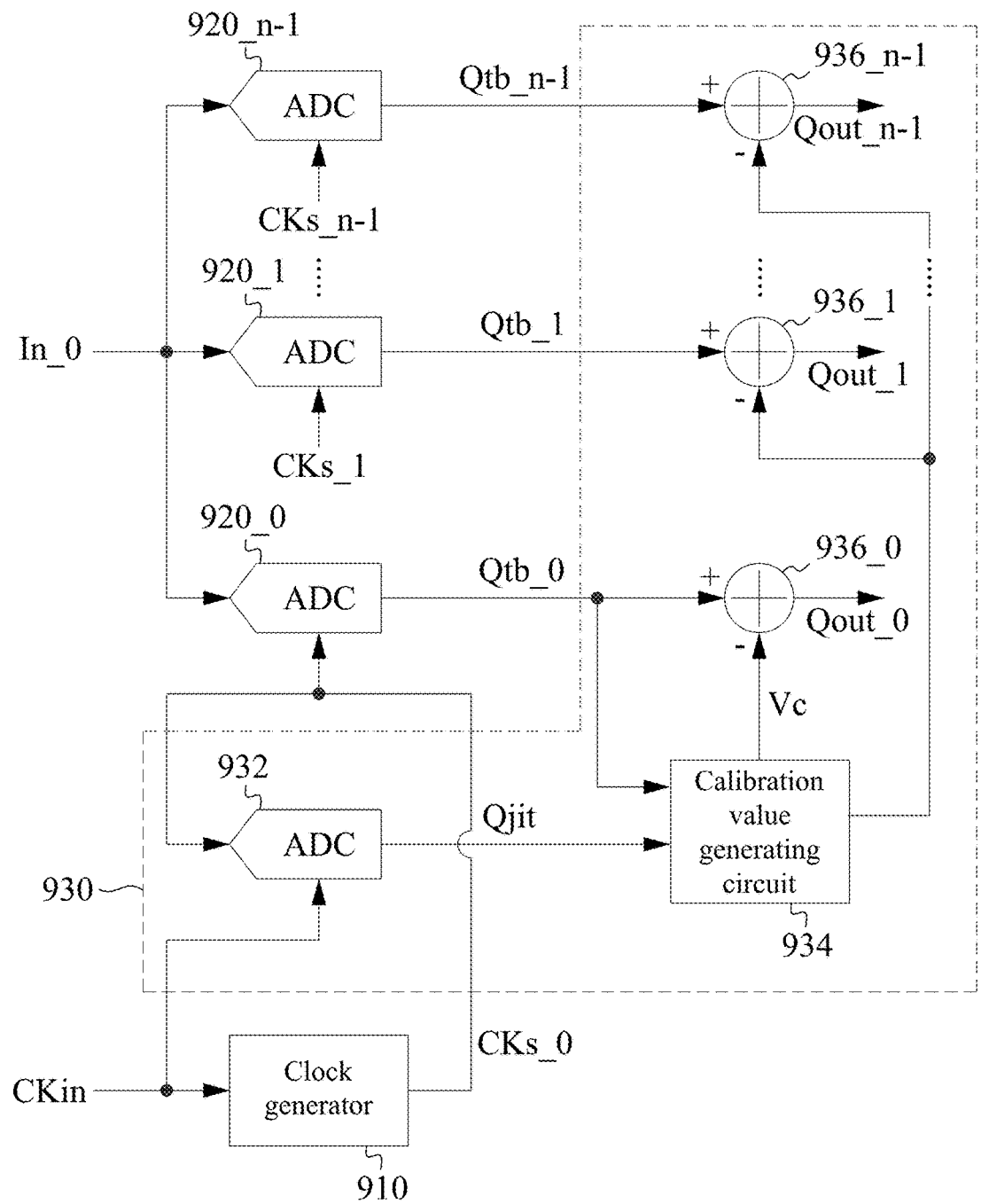
FIG. 9 is a simplified functional block diagram of an analog-to-digital converting device according to one embodiment of the present disclosure.

FIG. 9 is a simplified functional block diagram of an analog-to-digital converting device 900 according to one embodiment of the present disclosure. The analog-to-digital converting device 900 comprises a clock generator 910, a plurality of to-be-calibrated ADCs 920_0-920_n-1 and a calibration system 930. The calibration system 930 comprises a jitter-capturing ADC 932, a calibration value generating circuit 934 and a plurality of calculation circuits 936_0-936_n-1. The analog-to-digital converting device 900 is similar to the analog-to-digital converting device 800 of FIG. 8, and therefore only the differences are discussed below.

The to-be-calibrated ADCs 920_0-920_n-1 are configured to sample the input signal In_0 according to a plurality of clock signals CKs_0-CKs_n-1, so as to respectively generate the quantized outputs Qtb_0-Qtb_n-1. The clock signals CKs_0-CKs_n-1 are time-interleaved clock signals. In other words, in some embodiments, the analog-to-digital converting device 900 may be used to implement a time-interleaved ADC, and may comprise a multiplexer (not shown in FIG. 9) to generate a digital output signal based on the quantized outputs Qout_0-Qout_n-1. The to-be-calibrated ADC 920_0 samples according to the clock signal CKs_0. In some embodiments, a phase of the clock signal CKs_0 leads phases of the other time-interleaved clock signals CKs_1-CKs_n-1.

In some embodiments, the calibration system 830 of FIG. 8 or the calibration system 930 of FIG. 9 also comprises a signal processing circuit (not shown). Before the clock signal CKs_0 is inputted to the jitter-capturing ADC 832 of FIG. 8 or the jitter-capturing ADC 932 of FIG. 9, the signal processing circuit is configured to conduct one or more of the following signal processing operations to the clock signal CKs_0: amplifying, frequency dividing and slope adjusting. In addition, the clock signal CKs_0 provided by the signal processing circuit to the jitter-capturing ADC 832 of FIG. 8 or the jitter-capturing ADC 932 of FIG. 9 may have a ramp waveform or a sawtooth waveform.

In the above embodiments, the to-be-calibrated ADC and the jitter-capturing ADC may have circuit structures that are the same or different.

Figure 10:
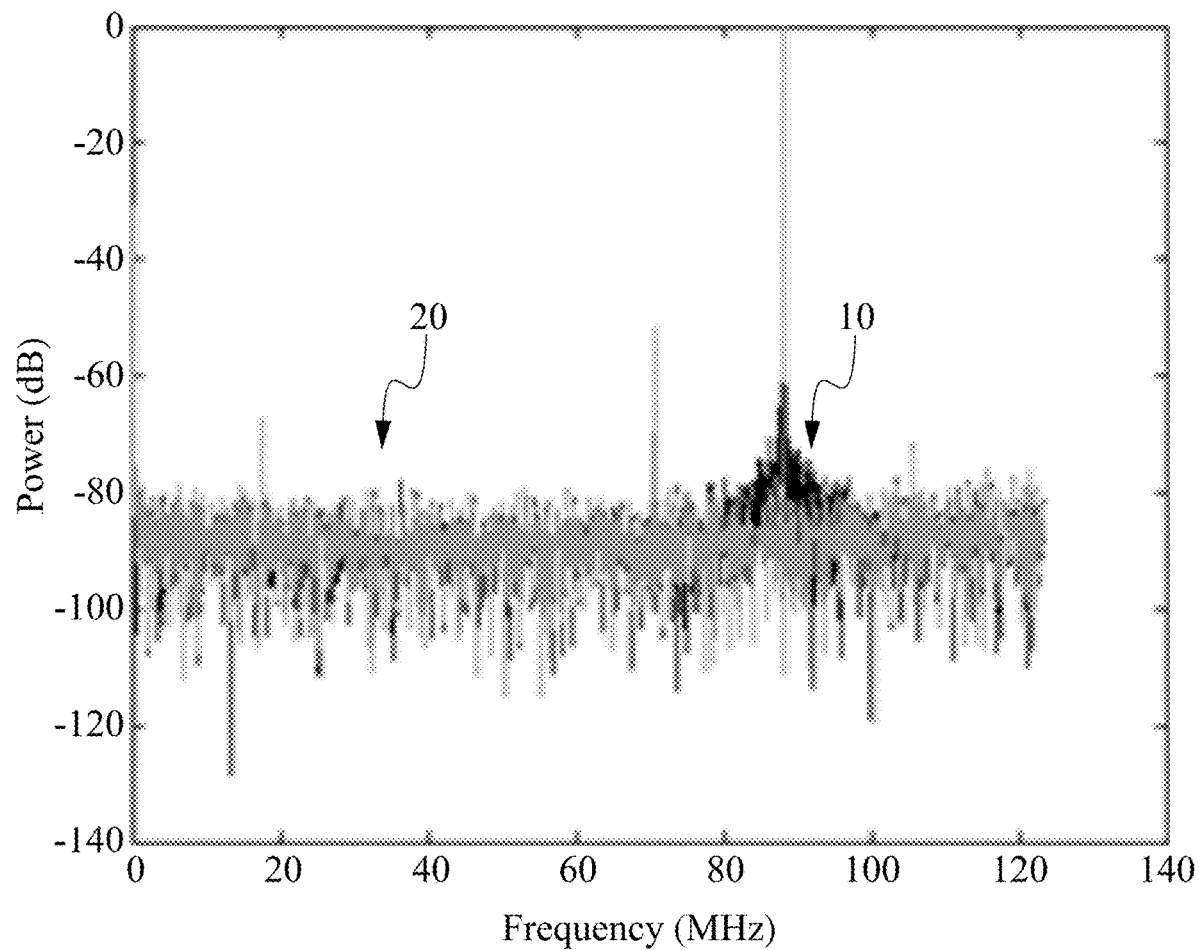
FIG. 10 is a schematic diagram of frequency spectrums of quantized outputs according to one embodiment of the present disclosure.

Reference is made to FIG. 1 and FIG. 10. FIG. 10 is a schematic diagram of frequency spectrums of quantized outputs according to one embodiment of the present disclosure. In the embodiment of FIG. 10, the frequency of the clock signal CKin is 52 MHz, and the frequency of the clock signal CKs_0 is 247 MHz. The ramp-shaped frequency spectrum 10 corresponds to the quantized output Qtb_0 of FIG. 1 that is to be calibrated. The ramp shape of the frequency spectrum 10 represents that the quantized output Qtb_0 is affected by the phase noise and has sampling error. On the other hand, the frequency spectrum 20 corresponds to the quantized output Qout_0 of FIG. 1 that is calibrated. The frequency spectrum 20 has no ramp-shaped portions, thereby proving that the quantized output Qout_0 that is calibrated is not or almost not affected by the phase noise.

Certain terms are used in the specification and the claims to refer to specific components. However, those of ordinary skill in the art would understand that the same components may be referred to by different terms. The specification and claims do not use the differences in terms as a way to distinguish components, but the differences in functions of the components are used as a basis for distinguishing. Furthermore, it should be understood that the term "comprising" used in the specification and claims is open-ended, that is, including but not limited to. In addition, "coupling" herein includes any direct and indirect connection means. Therefore, if it is described that the first component is coupled to the second component, it means that the first component can be directly connected to the second component through electrical connection or signal connections including wireless transmission, optical transmission, and the like, or the first component is indirectly electrically or signally connected to the second component through other component(s) or connection means.

It will be understood that, in the description herein and throughout the claims that follow, the phrase "and/or" includes any and all combinations of one or more of the associated listed items. Unless the context clearly dictates otherwise, the singular terms used herein include plural referents.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims and their equivalents.

What is claimed is:

1. A calibration system, comprising:
    a jitter-capturing analog-to-digital converter (ADC), configured to sample a to-be-sampled clock signal according to an operating clock signal in order to generate a first quantized output;
    a calibration value generating circuit, configured to receive the first quantized output and a second quantized output of a to-be-calibrated ADC in order to generate a calibration value, wherein the operating clock signal is for driving the to-be-calibrated ADC to sample, and the calibration value is related to a phase noise of the operating clock signal; and
    a first calculation circuit, coupled with the calibration value generating circuit, and configured to subtract the calibration value from the second quantized output to generate a third quantized output,
    wherein the calibration value generating circuit comprises:
        an error-capturing circuit, configured to receive the first quantized output, and configured to obtain a sampling time error of the to-be-calibrated ADC from the first quantized output, wherein the sampling time error is related to the phase noise;
        a differential circuit, configured to receive the second quantized output to calculate a slope of the second quantized output; and
        a second calculation circuit, configured to multiply the sampling time error by the slope to generate the calibration value.

2. The calibration system of claim 1, wherein the error-capturing circuit obtains a product of the sampling time error and a constant from the first quantized output, thereby obtaining the sampling time error, wherein the constant is negatively correlated with a period of the operating clock signal.

3. The calibration system of claim 2, wherein the period of the operating clock signal is M times of a period of the to-be-sampled clock signal, wherein M is a positive number and the constant is positively correlated with M.

4. The calibration system of claim 1, wherein the calibration system further comprises:
    a signal processing circuit, configured to conduct, before the to-be-sampled clock signal is inputted to the jitter-capturing ADC, one or more of the following operations to the to-be-sampled clock signal: amplifying, frequency dividing and slope adjusting.

5. The calibration system of claim 4, wherein the to-be-sampled clock signal is inputted to a clock generator, and the operating clock signal is generated by the clock generator according to the to-be-sampled clock signal.

6. The calibration system of claim 4, wherein the to-be-sampled clock signal outputted by the signal processing circuit has a ramp waveform or a sawtooth waveform.

7. A calibration system, comprising:
    a jitter-capturing analog-to-digital converter (ADC), configured to sample a to-be-sampled clock signal according to an operating clock signal in order to generate a first quantized output;
    a calibration value generating circuit, configured to receive the first quantized output and a second quantized output of a to-be-calibrated ADC in order to generate a calibration value, wherein the to-be-sampled clock signal is for driving the to-be-calibrated ADC to sample, and the calibration value is related to a phase noise of the to-be-sampled clock signal; and
    a first calculation circuit, coupled with the calibration value generating circuit, and configured to subtract the calibration value from the second quantized output to generate a third quantized output,
    wherein the calibration value generating circuit comprises:
        an error-capturing circuit, configured to receive the first quantized output, and configured to obtain a sampling time error of the to-be-calibrated ADC from the first quantized output, wherein the sampling time error is related to the phase noise;
        a differential circuit, configured to receive the second quantized output to calculate a slope of the second quantized output; and
        a second calculation circuit, configured to multiply the sampling time error by the slope to generate the calibration value.

8. The calibration system of claim 7, wherein the error-capturing circuit obtains a product of the sampling time error and a constant from the first quantized output, thereby obtaining the sampling time error, wherein the constant is negatively correlated with a period of the operating clock signal.

9. The calibration system of claim 8, wherein the period of the operating clock signal is 1/M times of a period of the to-be-sampled clock signal, wherein M is a positive number and the constant is negatively correlated with M.

10. The calibration system of claim 7, wherein the calibration system further comprises:
    a signal processing circuit, configured to conduct, before the to-be-sampled clock signal is inputted to the jitter-capturing ADC, one or more of the following operations to the to-be-sampled clock signal: amplifying, frequency dividing and slope adjusting.

11. The calibration system of claim 10, wherein the operating clock signal is inputted to a clock generator, and the to-be-sampled clock signal is generated by the clock generator according to the operating clock signal.

12. The calibration system of claim 8, wherein the to-be-sampled clock signal outputted by the signal processing circuit has a ramp waveform or a sawtooth waveform.

13. An analog-to-digital converting device, comprising:
a clock generator;
at least one to-be-calibrated analog-to-digital converter (ADC), wherein each to-be-calibrated ADC is configured to generate a second quantized output, and one of the at least one to-be-calibrated ADC samples according to an output of the clock generator in order to generate the second quantized output; and
a calibration system, configured to receive an input of the clock generator, the output of the clock generator and the second quantized output of the one of the at least one to-be-calibrated ADC in order to generate a calibration value, and configured to calibrate the second quantized output of each to-be-calibrated ADC according to the calibration value in order to generate a third quantized output,
wherein the calibration value is related to a phase noise of the output of the clock generator,
wherein the at least one to-be-calibrated ADC comprises a plurality of to-be-calibrated ADCs, wherein each to-be-calibrated ADC samples according to the output of the clock generator.

14. The analog-to-digital converting device of claim 13, wherein the at least one to-be-calibrated ADC comprises a plurality of to-be-calibrated ADCs, wherein the plurality of to-be-calibrated ADCs sample according to a plurality of time-interleaved clock signals, the plurality of time-interleaved clock signals comprise the output of the clock generator, and a phase of the output of the clock generator leads phases of the other time-interleaved clock signals of the plurality of time-interleaved clock signals.

15. The analog-to-digital converting device of claim 13, wherein the at least one to-be-calibrated ADC comprises a plurality of to-be-calibrated ADCs, wherein the calibration system comprises:
a jitter-capturing ADC, configured to sample the input of the clock generator according to the output of the clock generator in order to generate a first quantized output;
a calibration value generating circuit, configured to receive the first quantized output and the second quantized output of the one of the at least one to-be-calibrated ADC in order to generate the calibration value; and
a plurality of first calculation circuits, coupled with the calibration value generating circuit, and coupled with the plurality of to-be-calibrated ADCs, respectively, wherein each first calculation circuit is configured to subtract the calibration value from the second quantized output of a corresponding one of the plurality of to-be-calibrated ADCs, in order to generate the third quantized output.

16. The analog-to-digital converting device of claim 13, wherein the at least one to-be-calibrated ADC comprises a plurality of to-be-calibrated ADCs, wherein the calibration system comprises:
a jitter-capturing ADC, configured to sample the output of the clock generator according to the input of the clock generator in order to generate a first quantized output;
a calibration value generating circuit, configured to receive the first quantized output and the second quantized output of the one of the at least one to-be-calibrated ADC in order to generate the calibration value; and
a plurality of first calculation circuits, coupled with the calibration value generating circuit, and coupled with the plurality of to-be-calibrated ADCs, respectively, wherein each first calculation circuit is configured to subtract the calibration value from the second quantized output of a corresponding one of the plurality of to-be-calibrated ADCs, in order to generate the third quantized output.

* * * * *